(12) United States Patent
Fukiage

(10) Patent No.: US 6,576,569 B1
(45) Date of Patent: Jun. 10, 2003

(54) METHOD OF PLASMA-ASSISTED FILM DEPOSITION

(75) Inventor: Noriaki Fukiage, Tama (JP)

(73) Assignee: Tokyo Electron Limited, Tokyo-To (JP)

( * ) Notice: Subject to any disclaimer, the term of this patent is extended or adjusted under 35 U.S.C. 154(b) by 0 days.

(21) Appl. No.: 09/657,053

(22) Filed: Sep. 7, 2000

Related U.S. Application Data

(63) Continuation of application No. PCT/JP99/05203, filed on Sep. 22, 1999.

(30) Foreign Application Priority Data

Sep. 28, 1998 (JP) .......................................... 10-290037

(51) Int. Cl.$^7$ ............................................... H01L 21/31
(52) U.S. Cl. ...................... 438/784; 438/783; 438/789; 438/790
(58) Field of Search ................. 438/780, 783, 438/784, 789, 790, 793

(56) References Cited

U.S. PATENT DOCUMENTS

| | | | |
|---|---|---|---|
| 5,238,705 A | | 8/1993 | Hayashi et al. |
| 5,462,784 A | | 10/1995 | Grill et al. |
| 5,549,935 A | | 8/1996 | Nguyen et al. |
| 5,698,901 A | * | 12/1997 | Endo .......................... 257/642 |
| 5,942,328 A | | 8/1999 | Grill et al. |
| 5,942,769 A | * | 8/1999 | Grill et al. ..................... 257/77 |
| 6,150,258 A | * | 11/2000 | Mountsier et al. .......... 438/623 |

OTHER PUBLICATIONS

European Search Report re: EP 99 94 4797 dated Oct. 18, 2002.
"Chemically Crosslinked Flourocarbon Films for Thin Film Disk Lubrication", *IBM Technical Disclosure Bulletin*, vol. 39, No. 3, Mar. 1, 1996.
Grill et al., "Wear Resistant Flourinated Diamondlike Carbon Films", *Diamond Films and Technology*, vol. 6, No. 1, pp. 13–21, 1996.
Sah et al. "Amorphous Carbon Coatings Prepared by High Rate RF Plasma Deposition From Flourinated Benzenes", *Applied Physics Letters*, vol. 46, No. 8, pp. 739–741, Apr. 15, 1985.

* cited by examiner

*Primary Examiner*—Trung Dang
(74) *Attorney, Agent, or Firm*—Finnegan, Henderson, Farabow, Garrett & Dunner LLP

(57) ABSTRACT

This invention includes: a plasma-making step of making into plasma a film-forming gas including a compound of carbon and fluorine and an etching gas which can etch a film of fluorine-added carbon; and a film-forming step of forming a film of fluorine-added carbon onto an object to be processed by means of the plasma made in the plasma-making step. For example, the film-forming gas including a compound of carbon and fluorine includes a gas of a compound having a benzene ring. For example, the etching gas which can etch a film of fluorine-added carbon is a gas including fluorine. According to the invention, a concave portion can be satisfactory filled up with the CF film.

10 Claims, 10 Drawing Sheets

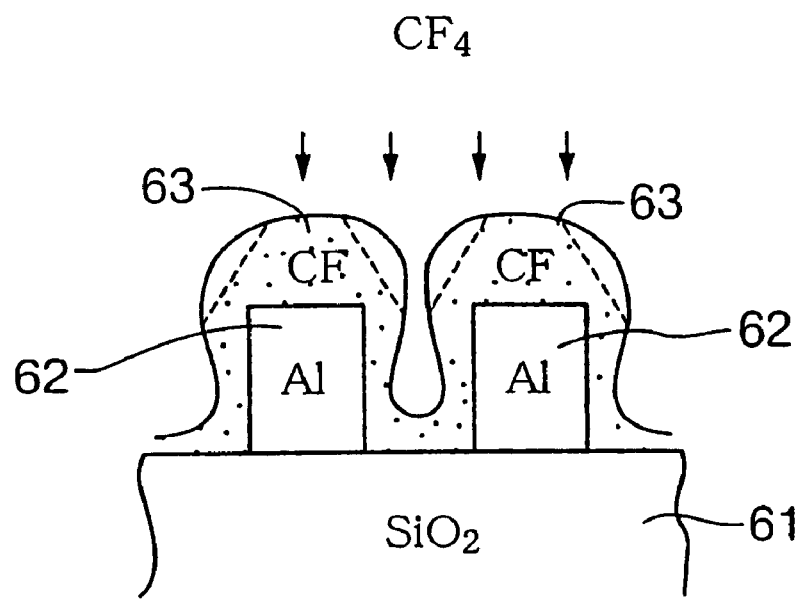
F I G. 5
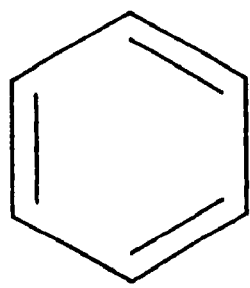 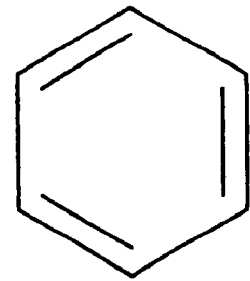
(A)   (B)
F I G. 7

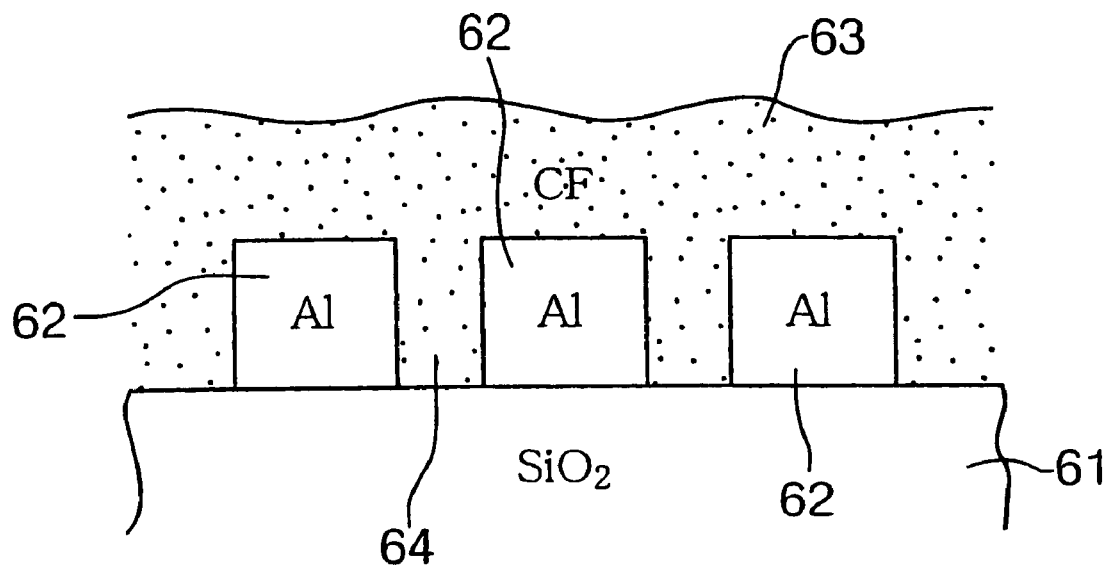
F I G. 8 (a)
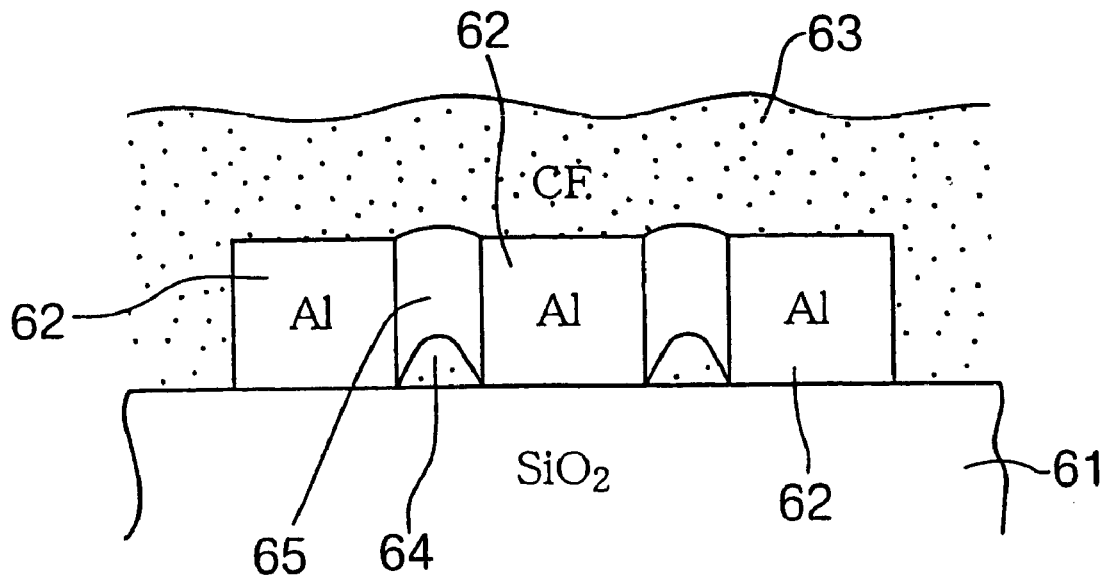
F I G. 8 (b)

(a)

(b)

METHOD OF PLASMA-ASSISTED FILM DEPOSITION

CROSS REFERENCE TO RELATED DOCUMENTS

This application is a Continuation of International Application No. PCT/JP99/05203, filed Sep. 22, 1999.

FIELD OF THE INVENTION

This invention relates to a method for forming for example an interlayer dielectric film of a semiconductor device, for example a film of carbon added fluorine (fluorine-added carbon).

BACKGROUND OF THE INVENTION

In order to integrate semiconductor devices in higher density, various ideas have been proposed, for example, making patterns minute or multilayering circuits. As one of the ideas, there is known an art for multilayering wires. In order to achieve a multilayered wiring structure, an (n)-th wiring layer and an (n+1)-th wiring layer are connected with each other via an electric conducting layer. In addition, a thin film, which is called an interlayer dielectric film, is formed at an area or areas except the electric conducting layer.

An $SiO_2$ film is a typical interlayer dielectric film. However, recently, it is required to lower a dielectric constant of the interlayer dielectric film in order to raise a speed of operation of the device further more. Then, characteristics of materials for the interlayer dielectric films are examined and studied. The $SiO_2$ has a dielectric constant of about 4. Thus, various efforts have been made to find or form a material having a smaller dielectric constant. As one of the efforts, an SiOF film having a dielectric constant of 3.5 has been developed. However, inventors of this invention have paid attention to a film of flurorine-added carbon (hereafter, which is abbreviated as a CF film) having a further smaller dielectric constant.

Such a CF film is formed for example by using Argon (Ar) gas as a plasma gas, using a mixed gas including a compound gas of carbon (C) and fluorine (F) and a hydrocarbon gas as a film-forming gas, and making the film-forming gas into plasma in a plasma unit which can generate plasma for example by using electron cyclotron resonance. Then, the inventors have examined to use $C_6F_6$ (hexafluorobenzene) gas as the film-forming gas in order to raise thermal stability of the CF film.

SUMMARY OF THE INVENTION

If the CF film is used as an interlayer dielectric film, for example as shown in FIG. 10, a CF film 13 is accumulated on a $SiO_2$ film 11 on which aluminum wires 12 are formed, so that gaps between the wires 12, 12 are filled up with the CF film 13. However, if $C_6F_6$ gas is used as the film-forming gas, since the $C_6F_6$ gas has a benzene ring i.e. a molecule of the $C_6F_6$ is large, as shown in FIG. 10(a), shoulder-like portions of the accumulated film above both side edges of a concave portion 14 between the wires 12,12 bulge out while the CF film 13 is accumulated. Then, the shoulder-like portions may contact with each other to block access to the concave portion 14. Thus, even if the concave portion 14 has an aspect ratio that is not so large, the concave portion 14 can not be filled with the CF film 13. That is, a or more large voids (spaces) 15 may be formed in the portion (see FIG. 10(b)).

This invention is intended to solve the above problem. The object of this invention is to provide a plasma film-forming method which can satisfactory fill up a concave portion with a CF film.

In order to achieve the object, a plasma film-forming method (a method of plasma-assisted film deposition) has a feature of comprising: a plasma-making step of making into plasma a film-forming gas including a compound of carbon and fluorine and an etching gas which can etch a film of fluorine-added carbon; and a film-forming step of forming a film of fluorine-added carbon onto an object to be processed by means of the plasma made in the plasma-making step.

According to the feature, if the CF film is used as an interlayer dielectric film, since the etching gas for etching the CF film is supplied in addition to the film-forming gas, a concave portion can be satisfactory filled up with the CF film.

The film-forming gas including a compound of carbon and fluorine includes for example a gas of a compound having a benzene ring, in particular hexafluorobenzene.

Preferably, the etching gas which can etch a film of fluorine-added carbon is a gas including fluorine, a gas including oxygen or a gas including hydrogen.

Preferably, hydrocarbon gas or a gas including silicon is supplied in addition to the film-forming gas and the etching gas, in the plasma-making step.

BRIEF DESCRIPTION OF THE DRAWINGS

FIG. 5 is a view for explaining an effect of the invention;

FIG. 7 is a view for explaining an effect of $C_6F_6$ gas;

FIGS. 8(a)–8(b) show sectional views for explaining results of experiments that have carried out for confirming effects of the invention;

DESCRIPTION OF THE PREFERRED EMBODIMENT

Figure 1:
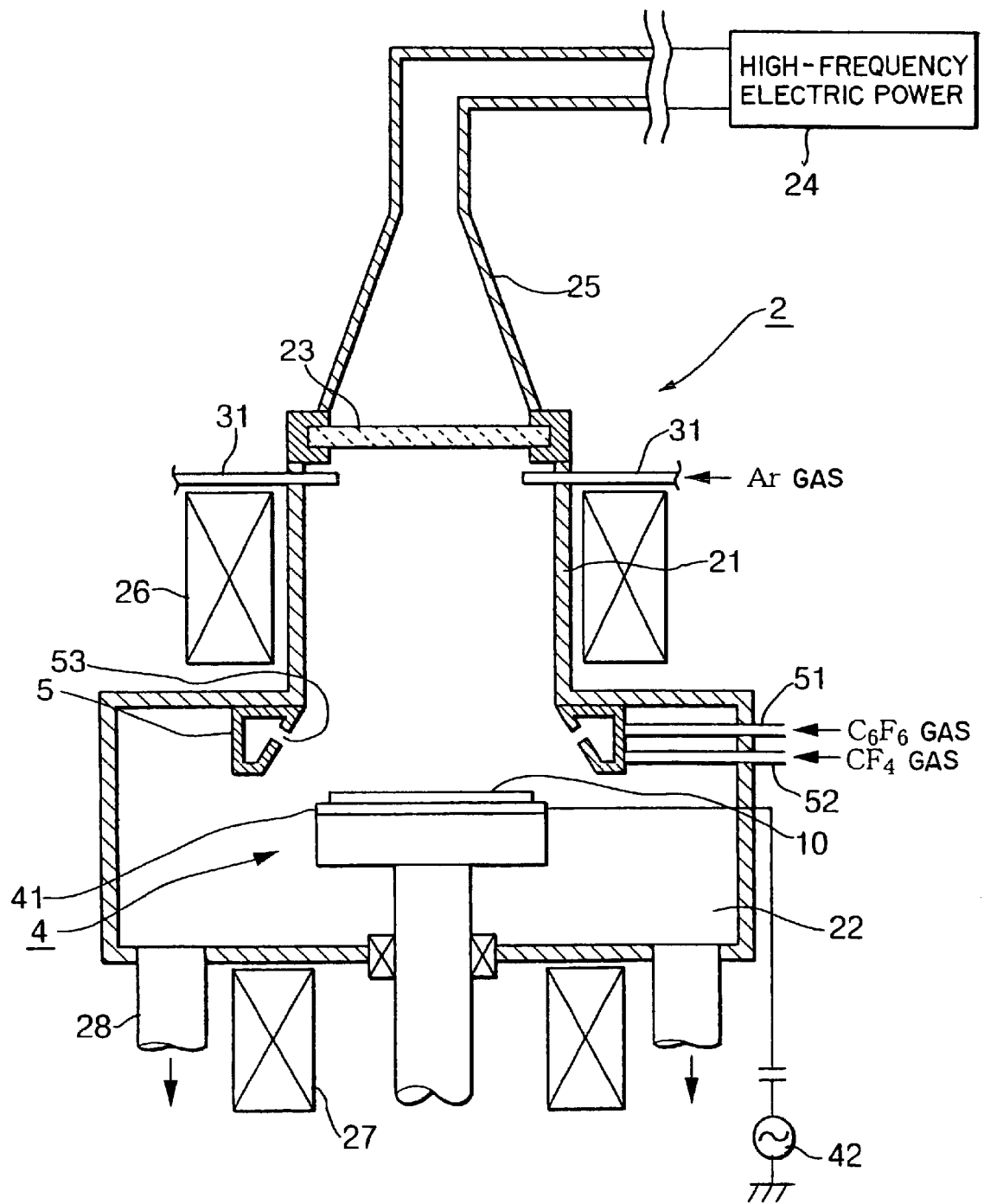
FIG. 1 is a vertical sectional view of an example of a plasma film-forming unit for carrying out a method according to the invention.

At first, an example of a plasma film-forming unit used in an embodiment according to the invention is shown in FIG. 1. The unit includes a vacuum container 2 made of for example aluminum or the like. The vacuum container 2 includes a first cylindrical vacuum chamber 21 located in an upper portion thereof for generating plasma, and a second cylindrical vacuum chamber 22 having a diameter larger than that of the first vacuum chamber 21. The second vacuum chamber 22 is arranged under and connected to the first vacuum chamber 21. In addition, the vacuum container 2 is grounded to be in zero potential.

An upper end of the vacuum container 2 has an opening. A penetrable window 23 made of a microwave penetrable material such as a crystal is sealingly fitted in the opening. Thus, an inside of the vacuum container 2 can be maintained at a vacuum. A wave guide 25 is provided outside of the penetrable window 23. The wave guide 25 is connected to a high-frequency power source 24, which can generate a microwave of for example 2.45 GHz. Then, the microwave generated by the high-frequency power source 24 is introduced via the wave guide 25 by for example a TE mode. Alternatively, the microwave guided by the TE mode is converted to a TM mode in the wave guide 25, and the converted microwave can be introduced into the first vacuum chamber 21 through the penetrable window 23.

A plurality of gas nozzles 31 are arranged around a side wall defining the first vacuum chamber 21, for example at substantially regular intervals in a peripheral direction thereof. The plurality of gas nozzles 31 are connected to a gas source such-as a plasma-generating gas source not shown. Thus, a plasma-generating gas such as Ar gas can be uniformly supplied into an upper portion of the first vacuum chamber 21.

A stage 4 for a semiconductor wafer 10 (hereafter, which is abbreviated as a wafer) is arranged in the second vacuum chamber 22 to face the first vacuum chamber 21. The stage 4 has an electrostatic chuck 41 in a surface portion thereof. Electrodes of the electrostatic chuck 41 are connected to a direct-current power source (not shown) for sticking to the wafer and to a high-frequency power source 42 for applying a bias electric power (bias-potential) to draw ions up to the wafer.

A circular film-forming-gas supplying member 5 is provided at an upper portion of the second vacuum chamber 22, that is, at a connecting portion of the second vacuum chamber 22 and the first vacuum chamber 21. For example, a firm-forming gas is supplied from a gas-supplying tube 51 and an etching gas added to the film-forming gas is supplied from a gas-supplying tube 52 into the film-forming-gas supplying member 5, respectively. Then, the film-forming-gas supplying member 5 is adapted to supply these gases into the vacuum container 2 via gas holes 53 which are formed in an inside surface thereof.

A magnetic-field forming means such as a circular main electromagnetic coil 26 is arranged around and near to the side wall defining the first vacuum chamber 21. A circular auxiliary electromagnetic coil 27 is arranged below the second vacuum chamber 22. Exhausting pipes 28 are connected to a base plate of the second vacuum chamber 22, for example at two positions symmetric with respect to a central axis of the vacuum chamber 22.

Then, a method of the invention carried out by using the above unit is explained with reference to FIGS. 3 and 4. In the case, a CF film 63 is formed as an interlayer dielectric film on a $SiO_2$ film 61 which is formed on a wafer 10 and on which aluminum wires 62, 62 are formed. A feature of the invention is that an etching gas for etching a film of fluorine-added carbon is supplied in addition to a film-forming gas that consists of for example a compound gas including a compound of carbon and fluorine.

In detail, at first, a gate valve (not shown) provided at a side wall of the vacuum container 2 is opened. A conveying arm (not shown) conveys the wafer 10, on whose surface the aluminum wires are formed, from a load-lock chamber (not shown) onto the stage 4 via the gate valve. The wafer 10 conveyed onto the stage 4 is electrostaticly adhered to the electrostatic chuck 41. Then, the CF film 63 is formed on the surface of the $SiO_2$ film 61.

That is, the gate valve is closed, and the inside of the vacuum container 2 is hermetically closed. Then, gas of the inside of the vacuum container 2 is exhausted from the exhausting pipes 28, so that the inside of the vacuum container 2 is produced to a predetermined vacuum and maintained at a predetermined process pressure. In such a state, a plasma-generating gas such as Ar gas is introduced into the first vacuum chamber 21 through the gas nozzles 31 at a flow rate of for example 90 sccm. At the same time, a film-forming gas including a compound of carbon and fluorine and including a benzene ring such as $C_6F_6$ gas and an etching gas capable of etching a CF film such as $CF_4$ gas are introduced from the film-forming gas supplying member 5 into the second vacuum chamber 22 at respective flow rates of for example 40 sccm and 20 sccm, respectively. Then, the high-frequency wave (microwave) of 2.45 GHz and 1 kW is supplied by the high-frequency power source 24, and a bias voltage of 13.56 MHz and 2.5 kW is applied to the stage 4 by the high-frequency power source 42.

Thus, the microwave from the high-frequency power source 24 is introduced into the first vacuum chamber 21 through the wave guide 25 and through the penetrable window 23 at the ceiling of the vacuum container 2. In the vacuum container 2, the main electromagnetic coil 26 and the auxiliary electromagnetic 27 form a magnetic field in a direction from an upper portion of the first vacuum chamber 21 toward a lower portion of the second vacuum chamber 22. For example, a strength of the magnetic field at a lower portion of the first vacuum chamber 21 is 875 gauss.

An electric cyclotron resonance is generated by an interaction between the magnetic field and the microwave. The resonance causes the Ar gas to become plasma and to be much dense. Since the plasma is made of Ar gas, the plasma is much stable.

The plasma flows from the first vacuum chamber 21 into the second vacuum chamber 22 and activates (makes into plasma) the $C_6F_6$ gas and the $CF_4$ gas, which are supplied thereinto, to produce activated species (plasma).

Ar ions, that are plasma ions, are drawn toward the wafer 10 by the bias electric potential for drawing the plasma. Then, the spatter-etching effect of the Ar ions cut off edges of the CF film accumulated on a pattern (concave portion) of the surface of the wafer 10 in order to enlarge an opening for access to the concave portion. Thus, the CF film is formed and fills up the concave portion.

In a case of manufacturing actual devices, after that, the CF film may be etched with a predetermined pattern. For example, W films may fill concave portions to form circuits of W.

Figure 2:
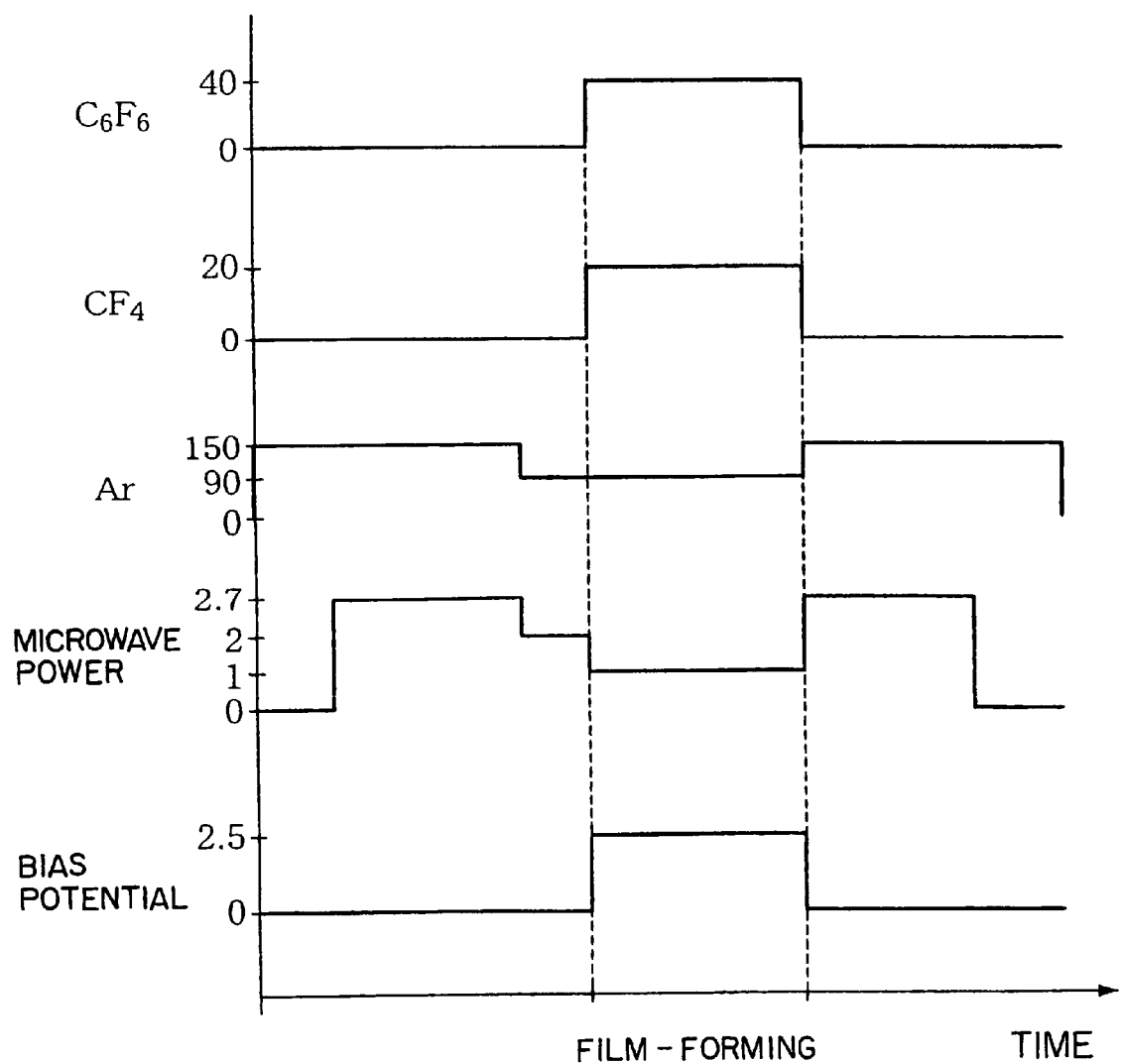
FIG. 2 is a view for explaining a sequence of processes according to the invention.

FIG. 2 shows a sequence of processes. As shown in FIG. 2, in the actual processes, the Ar gas starts to be introduced at a flow rate of 150 sccm at first. Then, microwave power of 2.7 kW is supplied. After a predetermined time has passed, the flow rate of the Ar gas is changed into 90 sccm and the microwave power starts to be decreased toward 1 kW step-by-step and/or gradually. When the microwave power is decreased to 1 kW, at the same time, the $CF_4$ gas starts to be introduced at the flow rate of 40 sccm, the $C_6F_6$ gas starts to be introduced at the flow rate of 20 sccm and the bias power of 2.5 kW starts to be supplied. After that, the film-forming process is conducted for a predetermined time.

Then, the $CF_4$ gas and the $C_6F_6$ gas stop being introduced, the bias power stops being supplied, the flow rate of the Ar gas is changed back into 150 sccm and the microwave power is changed back into 2.7 kW. Thus, the film-forming process is completed. Then, after a predetermined time has passed, the microwave power stops being supplied and then the Ar gas stops being introduced, that is, the series of processes is completed.

In the invention, the $CF_4$ gas for etching the CF film is added to the $C_6F_6$ gas being the film-forming gas. Thus, as clearly shown by experiments described below, the CF film can satisfactorily fill concave portions while less voids are generated. The reason may be guessed as follows.

Figure 3:
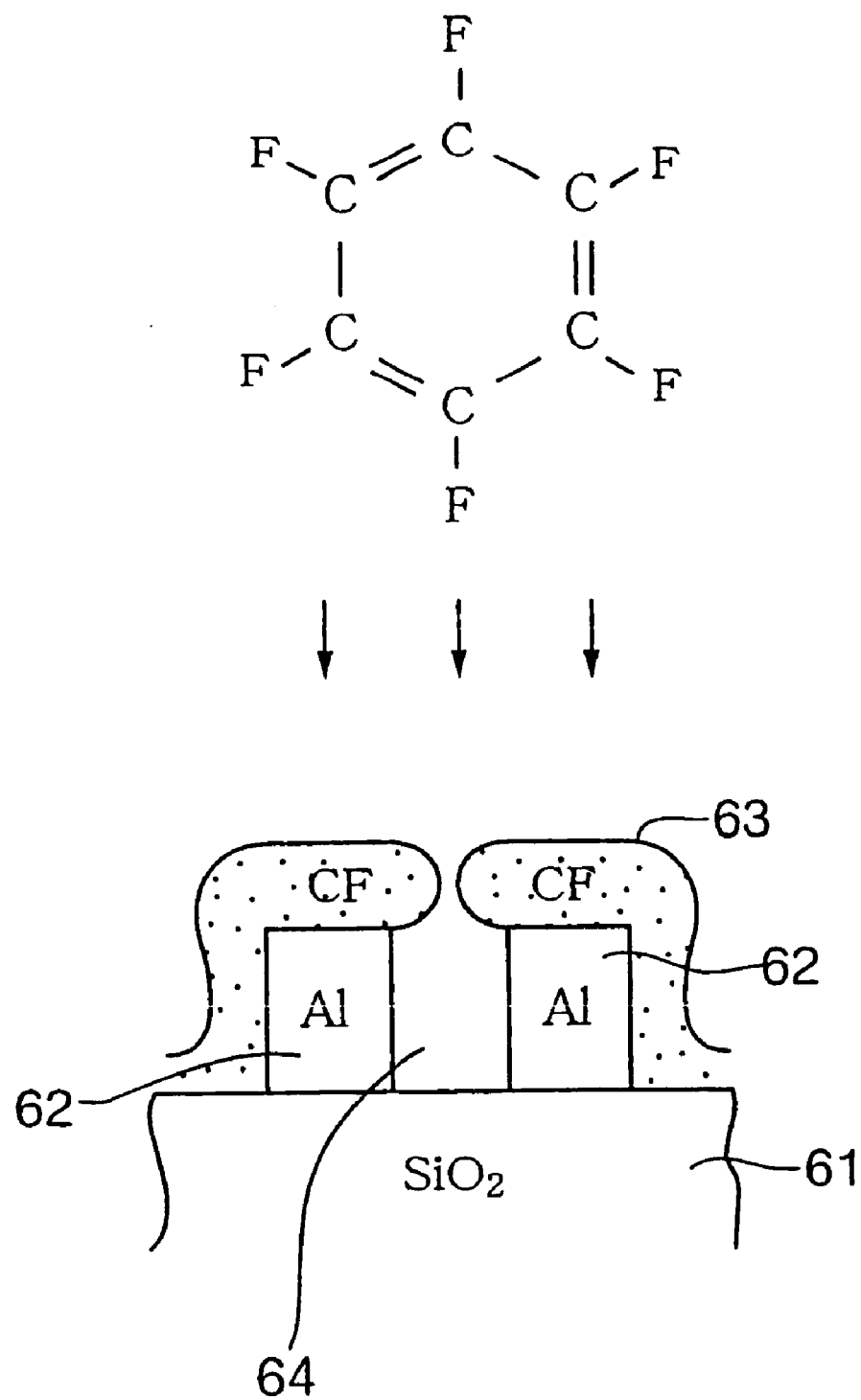
FIG. 3 is a view for explaining an effect of the invention.
Figure 4:
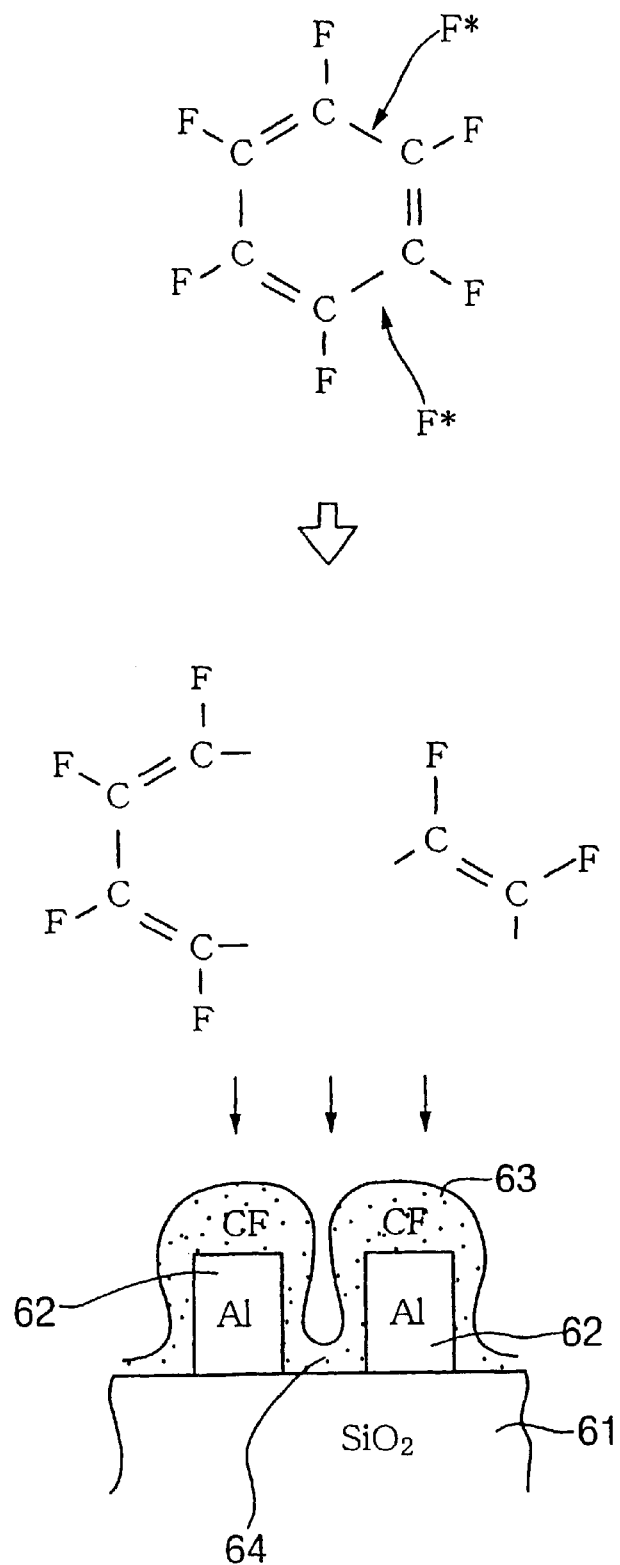
FIG. 4 is a view for explaining an effect of the invention.

As shown in FIG. 3, since the $C_6F_6$ gas has a benzene ring, the molecule of the $C_6F_6$ gas is large and the intra-molecular bonding-force thereof is strong. Thus, when only the $C_6F_6$ gas is used for forming the CF film 63 onto the $SiO_2$ film 61 which has an aluminum pattern making concave portions 64 each of that has a width of for example about 0.3 μm, the $C_6F_6$ gas is made into plasma while maintaining the large molecular state. Thus, it may be difficult for the $C_6F_6$ gas to go into inside areas of the concave portions 64.

In addition, the $C_6F_6$ gas, whose molecule has a ringed structure and is large and whose intra-molecular bonding-force is strong, is gradually accumulated. Thus, the CF film 63 can not be accumulated on both side surfaces of the small-frontage concave portions 64, but tends to be accumulated above the concave portions 64 in such a manner that shoulder-like portions of the accumulated film bulge out and block access to the concave portions 64 (see FIG. 3). Thus, it may be more difficult for the $C_6F_6$ gas to go into the concave portions 64. As a result, it may be guessed that the portions tend to be large voids.

On the other hand, if the $CF_4$ gas is added to the $C_6F_6$ gas, the $C_6F_6$ gas is made into plasma together with the $CF_4$ gas in the vacuum container 2. As the $CF_4$ gas has an etching function against the CF film, it may be guessed that strong intra-molecular bonding of the $C_6F_6$ can be cut off because of the $CF_4$ gas. That is, F in the $CF_4$ made into plasma reacts with C in the $C_6F_6$ to be a C—F gas, so that the C—C bonding of the $C_6F_6$ is cut off.

It is guessed that the intra-molecular bonding may be cut off in the CF film formed by the $C_6F_6$ or in the $C_6F_6$ gas. If the bonding in the CF film is cut off, the molecule at the cut portion becomes small and the cut small molecule may be rebonded. Thus, it is guessed that the CF film 63 may be easily accumulated on the side surfaces of the concave portions 64. In addition, as shown in FIG. 4, if the bonding in the $C_6F_6$ gas is cut off, the ringed structure is broken down and the molecule becomes small. Thus, it is guessed that the small molecule may easily go into inside areas of the concave portions 64.

In addition, the $CF_4$ gas can etch the CF film 63 itself. Thus, it is guessed that as shown in FIG. 5, while the CF film is formed by the $C_6F_6$ gas, spatter-etching is conducted by the $CF_4$ gas in such a manner that the shoulder-like portions of the film above the concave portions 64 between the wires 62, 62 are removed to enlarge the frontages of the concave portions 64.

Thus, during the film-forming process, broken components of the $C_6F_6$ go into the concave portions 64 through the frontages thereof enlarged by cutting off the bonding of the CF film 63 and/or by spatter-etching the CF film 63. Thus, the CF film tends to be accumulated on bottom areas of the concave portions 64. As a result, the concave portions 64 can be filled up while less voids are formed. In addition, it is guessed that degree of breaking down the molecules of the $C_6F_6$ gas may be adjusted by an amount of the added etching gas.

Figure 6:
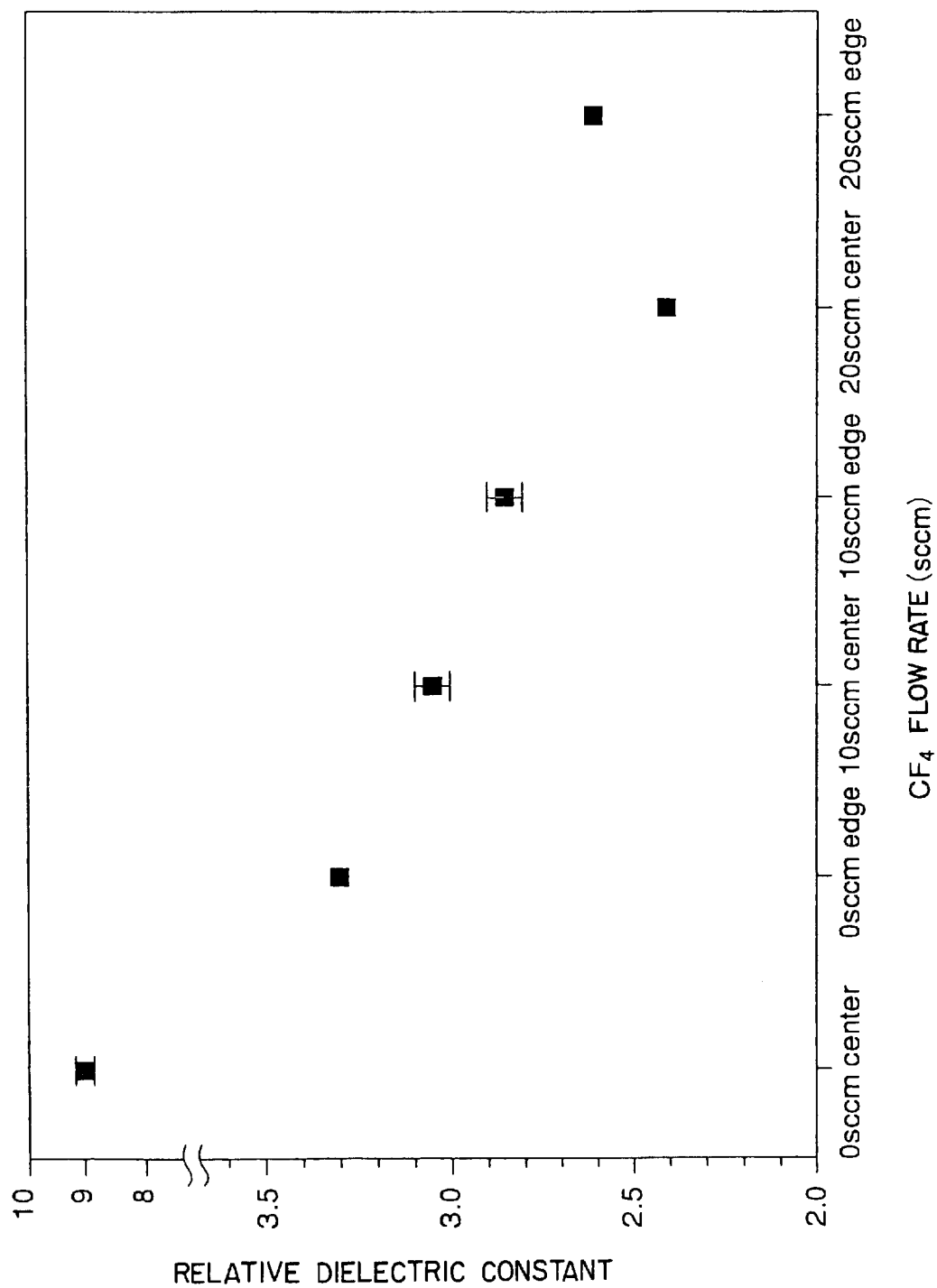
FIG. 6 is a graph of showing a relationship between flow rates of $CF_4$ gas and relative dielectric constants.

In addition, the CF film formed by the method of the invention has a high insulation performance, which is clearly shown by the experiments described below. The reason is guessed to be that the bonding of the $C_6F_6$ is cut off by the added $CF_4$ gas and that F is rebonded to the cut-off portions to prevent electric current from flowing. In addition, the dielectric constant can be more reduced by taking F into the CF film by means of rebonding of F. Thus, the CF film formed by the method of the invention can be used as an interlayer dielectric film very effectively. FIG. 6 shows a graph of showing a relationship between flow rates of $CF_4$ gas and relative dielectric constants.

In addition, since the $C_6F_6$ gas is used as the film-forming gas in the above process, the formed CF film has a high thermal stability. Herein, the high thermal stability means that even if the CF film is heated to a high temperature, an F (fluorine)-gas such as F, CF, or $CF_2$ tends not to break away from the CF film. If the F-gas tends not to break away from the CF film, corrosion of metal wires, undulating and/or cracking of the aluminum wires, rising of the relative dielectric constant and so on may be prevented.

As described above, the reason why the thermal stability is high when the $C_6F_6$ gas is used as the film-forming gas is guessed as follows. As shown in FIG. 7, the benzene ring is stable because the A-state and the B-state resonate with each other and the C—C bonding is in an intermediate state between a single-bonding state and a double-bonding state. Thus, the C—C combination in the benzene ring included in the CF film has a strong bonding-force. In addition, it is guessed that bonding of C in the benzene ring and C outside the benzene ring has a strong bonded-force as well. Thus, it is guessed that the CF or the $CF_2$ are prevented from breaking away. In addition, in the invention, the number of double-bonding is increased by recombination of the broken molecules in the CF film so that the film becomes dense. Thus, the thermal stability of the CF film may be more improved.

In the above process, a gas including F such as $C_2F_6$ gas, $C_4F_8$ gas, $C_5F_8$ gas, $NF_3$ gas or $SiF_4$ gas, a gas including O such as $O_2$ gas, $O_3$ gas, CO gas or $CO_2$ gas, or a gas including H such as $H_2$ gas, $H_2O$ gas, $H_2O_2$ gas or $NH_3$ gas may be used as the etching gas for etching the CF film, instead of the $CF_4$ gas.

If the gas including F is used, similarly to the $CF_4$ gas, F made into plasma reacts with C in the $C_6F_6$, so that the $C_6F_6$ is broken and/or the CF film is etched. If the gas including O is used, O made into plasma reacts with C in the $C_6F_6$ to be $CO_2$ gas, so that the $C_6F_6$ is broken and/or the CF film is etched. In addition, if the gas including H is used, H made into plasma reacts with C in the $C_6F_6$ or C in the CF film to be a C—H gas such as $CH_4$ or $C_2H_6$ and fly away, so that the $C_6F_6$ is broken and/or the CF film is etched.

If the gas including O is used, since C is carried away by O, density of F in the film is raised. If the gas including H is used, since C is carried away as a C—H gas, density of F in the film is raised.

As described above, even if the gas including F, the gas including O or the gas including H is used as the etching gas instead of the $CF_4$ gas, a CF film having a high insulation performance and a low dielectric constant may be formed.

In addition, in the invention, after the etching gas is added to the film-forming gas, a hydrocarbon gas such as $C_2H_2$ gas, $C_2H_4$ gas or $CH_4$ gas, or a gas including silicon such as $SiH_4$ gas, $Si_2H_6$ gas or $SiF_4$ gas may be added. In the case, since density of C and/or Si in the CF film may be raised, the thermal stability and/or the adhering property of the formed CF film may be improved.

Next, experiments conducted for confirming effects of the invention are explained. In the experiments, the plasma processing unit as shown in FIG. 1 was used. Each of the experiments was conducted to a wafer 10 on which wires had been formed in such a manner that each gap between two adjacent wires has an aspect ratio of 3. The film-forming process was conducted for 4 minutes and 40 seconds in order to form a CF film, while the $C_6F_6$ gas is introduced at a flow rate of 40 sccm as a film-forming gas, the $CF_4$ gas is introduced at a flow rate of 20 sccm as an etching gas and the Ar gas is introduced at a flow rate of 90 sccm as a plasma gas. In the case, the process was conducted according to the sequence shown in FIG. 2, while the microwave power and the bias power were set 1 kW and 2.5 kW, respectively (Example 1).

In addition, as a comparison, by using the plasma processing unit as shown in FIG. 1, the film-forming process was conducted for 3 minutes and 15 seconds in order to form a CF film, while the $C_6F_6$ gas is introduced at a flow rate of 40 sccm as a film-forming gas and the Ar gas is introduced at a flow rate of 30 sccm as a plasma gas (Comparison 1). In the case, the microwave power and the bias power were set 1 kW and 1.5 kW, respectively.

The CF film by the example 1 described above and the CF film by the comparison 1 described above were examined whether there were voids or not by a SEM (Scanning Electron Microscope). Consequently, as shown in FIG. 8(*a*), there were substantially no conspicuous voids in the concave portions 64 between the wires 62, 62 in the CF film of the example 1. However, as shown in FIG. 8(*b*), there were formed large voids 65 having a size of about 0.7 $\mu m \times 0.3 \mu m$ in the CF film of the comparison 1, because the CF film 63 was hardly accumulated on the side surfaces of the wires 62, although the CF film 63 was slightly accumulated on the bottom areas in the concave portions 64 between the wires 62, 62. According to the results, it was confirmed that if the CF film is formed in the process of the invention, the concave portions having a high aspect ratio might be satisfactorily filled with the CF film.

Similarly to the example 1, the CF film formed by using $O_2$ gas as an etching gas and the CF film formed by using $H_2$ gas as an etching gas were examined whether there were voids or not. Consequently, there were substantially no conspicuous voids in both of the films. In the case, the flow rate of the $O_2$ gas was 10 sccm and the flow rate of the $H_2$ gas was 20 sccm. The other conditions were kept the same as the example 1.

In addition, similarly to the example 1, the CF film formed by using $CF_4$ gas as an etching gas and by adding the $C_2H_2$ gas and the CF film formed by using $CF_4$ gas as an etching gas and by adding the $SiH_4$ gas were examined whether there were voids or not. Consequently, there were substantially no conspicuous voids in both of the films. That is, it was confirmed that even if these gases are added, the concave portions might be satisfactorily filled with the CF film.

In addition, the thermal stability was examined by means of a change in the weight between before and after an annealing process in the furnace, which change was measured by an electronic force balance. As a result, it was confirmed that the weight reduced by 1.7%. In addition, the adhering force was examined by a stud-pull method (Sebastian method). As a result, it was confirmed that the adhering force was 7 kpsi. In the case, the flow rate of the $C_2H_2$ gas was 10 sccm and the flow rate of the $SiH_4$ gas was 10 sccm. The other conditions were kept the same as the example 1.

In addition, with respect to the CF film formed by the method of the invention, the insulation property was examined. By using the plasma processing unit as shown in FIG. 1, the CF film was formed on a 8-inch wafer 10, while the $C_6F_6$ gas is introduced at a flow rate of 40 sccm as a film-forming gas, the $CF_4$ gas is introduced at flow rates described below as an etching gas and the Ar gas is introduced at a flow rate of 90 sccm as a plasma gas. In the case, the microwave power and the bias power were set 1 kW and 2.5 kW, respectively. Samples obtained according to the above manner were subject to a changeable electric field, so that electric currents in the samples were measured. The flow rate of the $CF_4$ gas was changed between 0 sccm and 20 sccm. The electric currents were measured at a central position of the wafer 10 and at a peripheral position of the wafer 10 (a position inward from the peripheral edge by 13 mm).

Figure 9A:
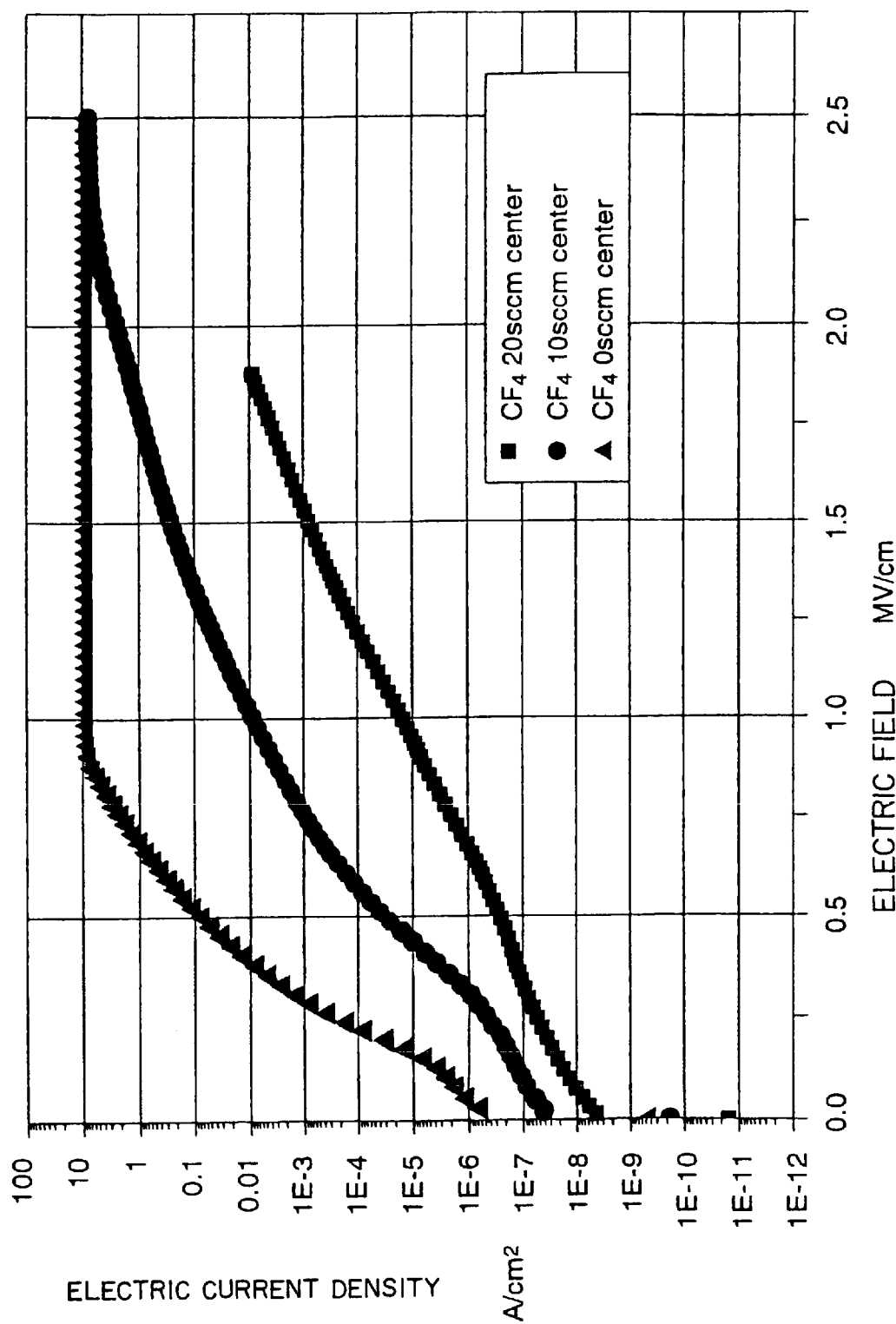
FIGS. 9(a)–9(b) show graphs of showing the results of the experiments that have carried out for confirming effects of the invention.
Figure 9B:
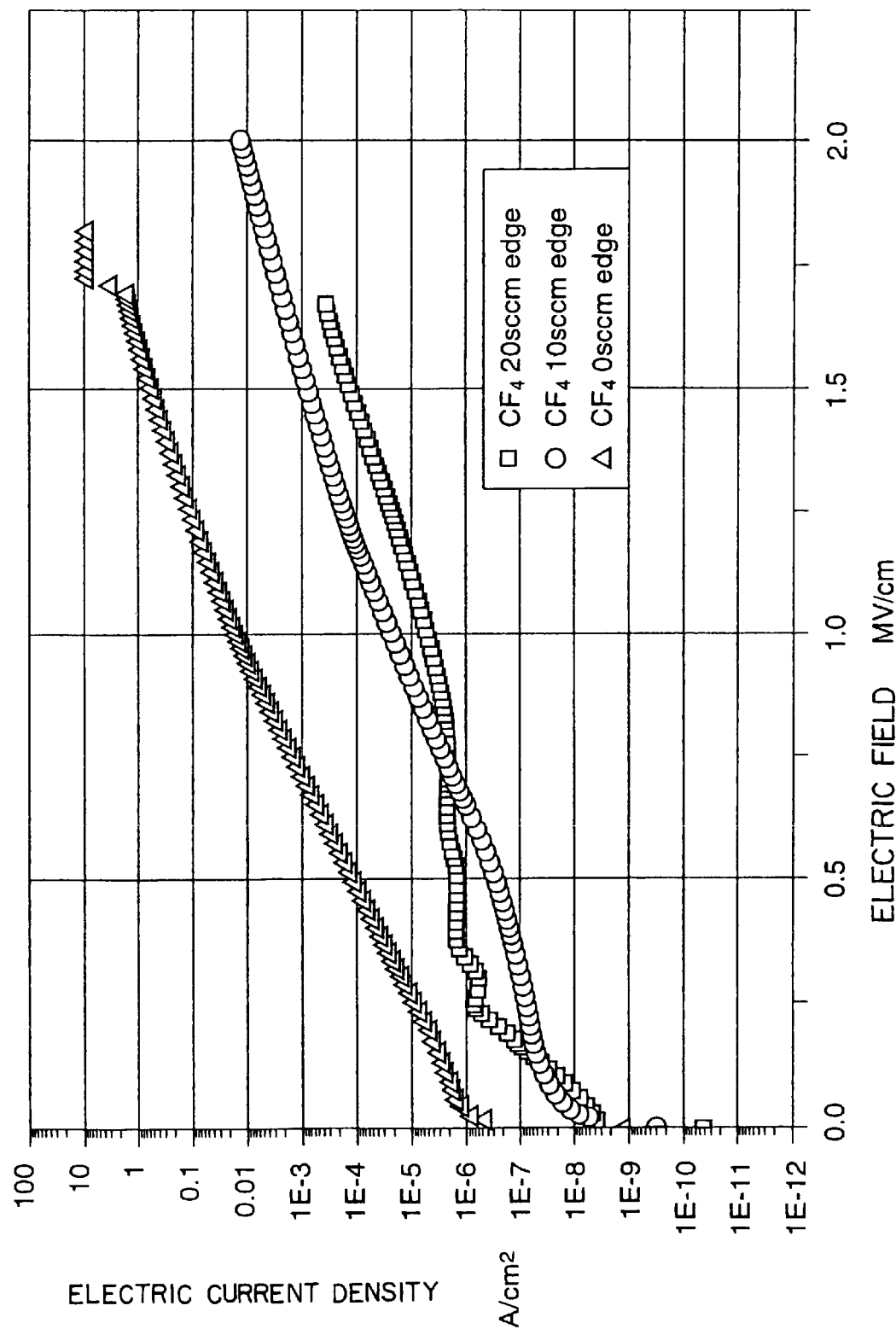
Figure 10:
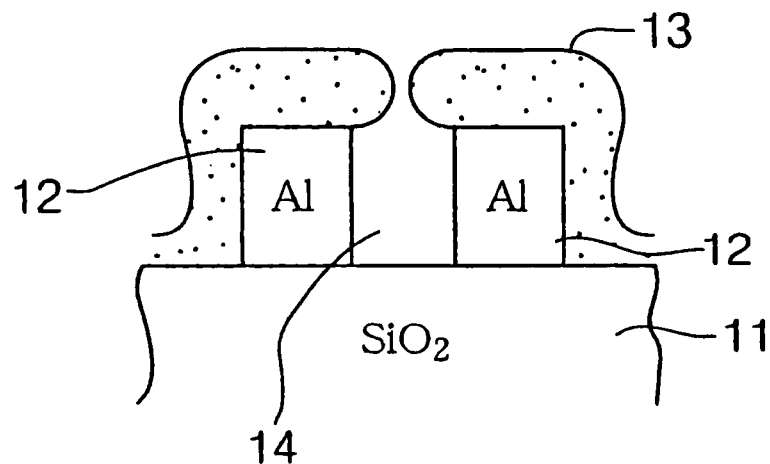
FIG. 10 is a sectional view for explaining a conventional state filled with a CF film.
Figure 10:
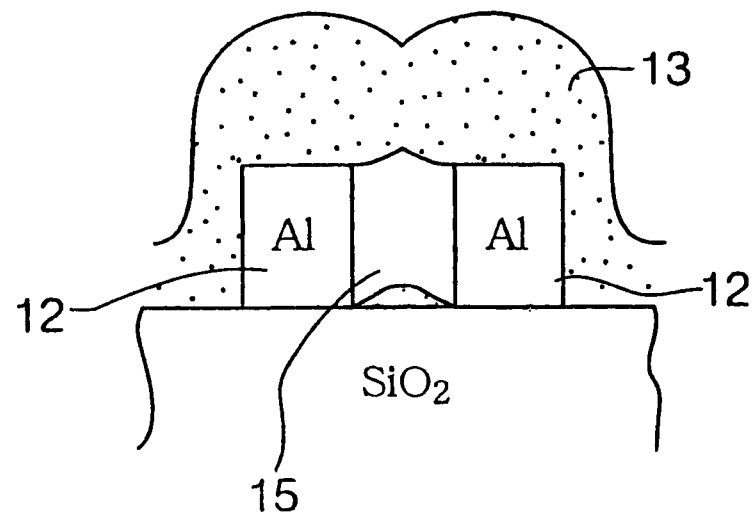

The results are shown in FIGS. 9(*a*)(*b*). In FIGS. 9(*a*)(*b*), the abscissa represents the electric field and the ordinate represents the electric-current density, respectively. ■ means that the flow rate of the $CF_4$ gas was 20 sccm and the measurement was conducted at the central position of the wafer 10. ● means that the flow rate of the $CF_4$ gas was 10 sccm and the measurement was conducted at the central position of the wafer 10. ▲ means that the flow rate of the $CF_4$ gas was 0 sccm and the measurement was conducted at the central position of the wafer 10. □ means that the flow rate of the $CF_4$ gas was 20 sccm and the measurement was conducted at the peripheral position of the wafer 10. ○ means that the flow rate of the $CF_4$ gas was 10 sccm and the measurement was conducted at the peripheral position of the wafer 10. Δ means that the flow rate of the $CF_4$ gas was 0 sccm and the measurement was conducted at the peripheral position of the wafer 10.

As shown in FIGS. 9(*a*)(*b*), the electric current was larger when the $CF_4$ gas was not added than when the $CF_4$ gas was added. That is, it was confirmed that the insulation property was raised by adding the $CF_4$ gas.

In the invention, the film-forming gas for the CF film may be a compound gas including a benzene ring such as octafluorotoluene or fluorobenzene. In addition, a compound gas of C and F such as 1,4-bistrifluoromethylbenzene ($C_6H_4(CF_3)_2$) or perfluorotoluene gas ($C_6F_5CF_3$) may be used.

In addition, this invention is not limited by the manner of generating plasma by ECR. For example, this invention may be applied to a case of generating plasma by a method called ICP (Inductive Coupled Plasma) wherein a coil wound around a dome-like container gives an electric field and a magnetic field to a process gas. This invention may also be applied to a case of generating plasma by an interaction of a helicon wave of for example 13.56 MHz and a magnetic field formed by a magnetic coil, which plasma is called helicon-wave plasma. This invention may also be applied to a case of generating plasma by applying a magnetic field to two parallel cathodes in a substantially parallel manner, which plasma is called magnetron plasma. This invention may also be applied to a case of generating plasma by applying a high-frequency electric power between electrodes facing with each other, which are called parallel-plates.

What is claimed is:

1. A plasma form-filing method for forming and accumulating a film of fluorine-added carbon as an interlayer dielectric film into a concave portion of a substrate to be processed on which predetermined patterned wires including the concave portion are formed, comprising:

a plasma-making step of making into plasma a film-forming gas including a compound gas having at least one benzene ring and fluorine, and another compound gas which can break up the benzene ring of the compound gas and which can etch the film of fluorine-added carbon, and a film-forming step of forming and accumulating the film of fluorine-added carbon into the concave portion of the substrate to be processed by means of the plasma made in the plasma-making step.

2. A plasma film-forming method according to claim 1, wherein:

the compound gas having at least the benzene ring and the fluorine is at least one of $C_6F_6$, octafluorotoluene, fluorobenzene, 1,4-bistrifluoromethylbenzene and perfluorotoluene gas.

3. A plasma film-forming method according to claim 1, wherein:

the compound gas which can etch the film of fluoro-added carbon is at least one of a compound gas including F, a compound gas including O and a compound gas including H.

4. A plasma film-forming method according to claim 3, wherein:

the compound gas including F is at least one of $CF_4$, $C_2F_6$, $C_4F_8$, $C_5F_8$, NF3 and $SiF_4$.

5. A plasma film-forming method according to claim 3, wherein:

the compound gas including O is at least one of $O_2$, $O_3$, CO and $Co_2$.

6. A plasma film forming method according to claim 3, wherein:

the compound gas including H is at least one of $H_2$, $H_2O$, $H_2O_2$ and $NH_3$.

7. A plasma film-forming method according to claim 1, wherein:

a hydrocarbon gas is added in the plasma-making step.

8. A plasma film-forming method according to claim 1, wherein:

a compound gas including Si is added in the plasma-making step.

9. A plasma film-forming method according to claim 7, wherein:

the hydrocarbon gas is at least one of $C_2H_2$, $C_2H_4$ and $CH_4$.

10. A plasma film-forming method according to claim 8, wherein:

the compound gas including Si is at least one of $SiH_4$, $Si_2H_6$ and $SiF_4$.

\* \* \* \* \*